(12) United States Patent
Hayashi et al.

(10) Patent No.: US 7,808,687 B2
(45) Date of Patent: Oct. 5, 2010

(54) HOLOGRAM RECONSTRUCTING APPARATUS AND HOLOGRAM RECONSTRUCTING METHOD

(75) Inventors: Kunihiko Hayashi, Kanagawa (JP); Nobuhiro Kihara, Kanagawa (JP); Hisayuki Yamatsu, Tokyo (JP); Norihiro Tanabe, Saitama (JP)

(73) Assignee: Sony Corporation, Tokyo (JP)

( * ) Notice: Subject to any disclaimer, the term of this patent is extended or adjusted under 35 U.S.C. 154(b) by 290 days.

(21) Appl. No.: 11/866,029

(22) Filed: Oct. 2, 2007

(65) Prior Publication Data
US 2008/0088897 A1    Apr. 17, 2008

(30) Foreign Application Priority Data
Oct. 12, 2006   (JP)   ............... 2006-279292

(51) Int. Cl.
*G03H 1/28* (2006.01)
(52) U.S. Cl. ................................ 359/24; 250/550
(58) Field of Classification Search ............... 359/1–35; 250/550; 430/1, 2
See application file for complete search history.

(56) References Cited

U.S. PATENT DOCUMENTS
2006/0153044 A1   7/2006   Hayashi et al.
2006/0245020 A1 *  11/2006  Kawano et al. ............... 359/29

FOREIGN PATENT DOCUMENTS

| JP | 2005-129196 | 5/2005 |
|---|---|---|
| JP | 2005-242304 | 9/2005 |
| JP | 2005-322400 | 11/2005 |
| JP | 2006-171589 | 6/2006 |
| JP | 2006-171593 | 6/2006 |
| JP | 2007-280593 | 10/2007 |
| JP | 2007-304263 | 11/2007 |
| JP | 2008-065932 | 3/2008 |

* cited by examiner

*Primary Examiner*—Stephone B Allen
*Assistant Examiner*—Jennifer L. Doak
(74) *Attorney, Agent, or Firm*—Oblon, Spivak, McClelland, Maier & Neustadt, L.L.P.

(57) ABSTRACT

A hologram reconstructing apparatus is disclosed. The apparatus includes: unnecessary light removing means for causing the imaging means to receive necessary light only included in the reconstruction light; driving means for operating the hologram recording medium or a reconstruction light optical system; light detecting means for detecting the state that reconstruction light is projected to the unnecessary light removing means of the light cut by the unnecessary light removing means; and control means for obtaining the displacement of the hologram recording medium based on the information on a specific part of the projection state information detected by the light detecting means and controlling the driving means to cancel the displacement and move the hologram recording medium or the optical system.

13 Claims, 18 Drawing Sheets

MOVE WITH CONSTANT VELOCITY

IN PHASE

NO SIGNALS OCCUR

OUT OF PHASE

AVAILABLE AS POSITION
CORRECTION SIGNAL

EXAMPLE WITH FOUR PDs

FOCUS ERROR DETECTION

TOO CLOSE

TOO FAR

FOCUS ERROR SIGNAL

HOLOGRAM RECONSTRUCTING APPARATUS AND HOLOGRAM RECONSTRUCTING METHOD

CROSS REFERENCES TO RELATED APPLICATIONS

The present invention contains subject matter related to Japanese Patent Applications JP 2006-279292 filed in the Japanese Patent Office on Oct. 12, 2006, the entire contents of which being incorporated herein by reference.

BACKGROUND OF THE INVENTION

1. Field of the Invention

The present invention relates to a hologram reconstructing apparatus and method that reconstruct data multiplexed on a hologram recording medium by angle multiplexing and in particular to ensuring the compatibility when a hologram recording medium is reset or is replaced by a hologram recording medium recorded by a different apparatus.

2. Description of the Related Art

From the past, in a recording operation on a hologram data storage, a hologram recording medium is placed in an area where two ray bundles of signal light and reference light interfere, and the interference fringes of the two ray bundles are recorded on the hologram recording medium. In this case, in order to improve the recording density on a hologram recording medium, hologram multiplexing is performed by various kinds of multiplexing such as angle multiplexing, shift multiplexing, speckle multiplexing and shift-phase code multiplexing.

In a hologram recording apparatus by angle multiplexing, two ray bundles of signal light and reference light are irradiated to a hologram recording medium. Every time the signal light is modulated spatially (modulated in intensity) on a data page displayed by a spatial light modulator (SLM), the incident angle (recording angle) of the reference light to the hologram recording medium is changed, and different pieces of record information are multiplexed on one same recording area.

In a hologram recording apparatus by angle multiplexing, multiple, such as 40, pieces of different record information can be recorded in one same recording area by changing the change in pitch of the recording angle of the reference light, such as in increments of 0.1 degree in the range of several degrees at maximum (by changing slightly in the range of 88 to 92 degrees, for example) and sequentially multiplexing different pieces of record information (data pages) in one same recording area. A set of data pages recorded in one same place is called "book" as required. One resulting from recording only one book is called "single book", and one resulting from recording multiple books is called "multibook".

On the other hand, a hologram reconstructing apparatus pairing with such a hologram recording apparatus is configured to reconstruct record information multiplexed in one same recording area by slightly changing the angle of the surface of a hologram recording medium against reference light for reconstruction. Here, the angle of the reference light for reconstruction against the surface of a hologram recording medium is called "reconstruction angle" as required in reconstruction with a hologram recording medium on which holograms are recorded by angle multiplexing. Furthermore, the reference angle of the reconstruction angle, such as the reconstruction angle equal to the normal of the surface of a hologram recording medium, for example, is called "reference reconstruction angle". The hologram reconstructing apparatus by angle multiplexing can reconstruct the record information recorded by a recording angle equal to a reconstruction angle for each reconstruction angle by slightly changing the reconstruction angle from the reference reconstruction angle according to the recording angle.

With the hologram recording apparatus and hologram reconstructing apparatus by angle multiplexing, multiple pieces of record information can be recorded for each recording angle of reference light in one same recording area, and the multiplexed record information pieces can be reconstructed separately. Therefore, the recording density and recording capacity can be dramatically increased.

By the way, even small amount of displacement of the set position of a hologram recording medium between recording and reconstructing makes finding a recording surface difficult since a hologram is generally recorded three-dimensionally in a recording area of a hologram recording medium and the surface of the hologram recording medium is a two-dimensional recording area (recording surface). This is because the wave information of the reference light in recording and the reference light in reconstructing may change when the position of a hologram recording medium changes, which prevents obtaining a reconstructed image. Furthermore, in order to increase the recording density to a hologram recording medium, the space between recording areas is necessarily decreased. However, when the distance between recording areas decreases, the record information in the adjacent recording place may be possibly reconstructed or the record information by a different recording angle may be possibly reconstructed even by the slight displacement of a hologram recording medium from a predetermined position in reconstructing. Therefore, a hologram recording medium is needed to set at the same position as that in recording in order to reconstruct data on the hologram recording medium, and precise positioning is demanded. Otherwise, the compatibility may not be obtained when a hologram recording medium is reset or played by a different apparatus or when a hologram recording medium recorded by a different apparatus is played, which may be one factor responsible for the prevention of the practical use of the method.

Accordingly, as a reference recording angle, the recording angle is defined for recording data on a specific recording surface on which data is to be recorded by a first recording angle, for example, in a hologram recording medium. Then, the recording angles after data is recorded on the specific recording surface are changed and fixed by a predetermined angle with reference to the defined reference recording angle. Therefore, a publicly known example (refer to JP-A-2003-337524 (Patent Document 1)) can improve the compatibility by allowing the reference recording angle determined by the mechanical states or defined conditions of recording angle changing means and optical system, for example, in the hologram recording apparatus side to agree with the reference recording angle in the hologram recording medium side at a specific recording time such as the first recording time. However, in the publicly known example, the positioning method is complicated and is allowed in angles/directions only. Therefore, the technology is not applicable to the positioning control over a hologram recording medium.

For this reason, a method has been proposed (refer to JP-A-2006-171589 (Patent Document 2)) that can secure and stabilize the compatibility upon reset of a hologram recording medium or upon playback in a different apparatus by performing highly precise positioning between reconstruction reference light and the hologram recording medium, without complicating an apparatus to be used.

SUMMARY OF THE INVENTION

However, the inventors have found that it is difficult for the latter publicly known example to obtain the information for positioning when the hologram recording intervals aligning in the direction of movement of a hologram recording medium and the spaces among photoreceptors of a detector that provides information for positioning are under a certain condition and in a case where data is reconstructed from a recording medium that records multiple books (that is, multibook reconstruction).

Accordingly, it is desirable to provide a hologram reconstructing apparatus and hologram reconstructing method that can secure and stabilize the compatibility upon reset of a hologram recording medium or upon playback in a different apparatus by performing highly precise positioning between reconstruction reference light and the hologram recording medium in any cases, without complicating the apparatus.

According to an embodiment of the present invention, there is provided a hologram reconstructing apparatus that irradiates reconstruction reference light to a hologram recording medium on which data is multiplexed, receives reconstruction light thus generated by the hologram recording medium by imaging means and demultiplexes and reconstructs the multiplexed data, the apparatus including unnecessary light removing means for causing the imaging means to receive necessary light only included in the reconstruction light, driving means for operating the hologram recording medium or a reconstruction light optical system, light detecting means for detecting the state that reconstruction light is projected to the unnecessary light removing means of the light cut by the unnecessary light removing means and control means for obtaining the displacement of the hologram recording medium based on the information on a specific part of the projection state information detected by the light detecting means and controlling the driving means to cancel the displacement and move the hologram recording medium or the optical system, wherein a or b is defined so as not to satisfy a=2nb where a is an interval between/among photoreceptors, which face across a hole, of the light detecting means, b is an interval of data recorded in multibook on the hologram recording medium, and n is a natural number.

According to the embodiment of the invention, in a normal set state without any displacement of a hologram recording medium, the unnecessary light removing means such as an aperture allows necessary light (zeroth order light) in reconstruction light to pass through but does not allow unnecessary light such as a crosstalk component from an adjacent recording area to pass through. It is projected by the surface of the aperture. However, when a hologram recording medium is displaced, it is difficult for necessary light to pass through the aperture, and the necessary light appears in the reconstruction light projection state information in an inner part of the projection area of the reconstruction light generated from the recording area in the outer circumference of the through hole of the aperture and adjacent to the recording area that is the reconstruction target. Thus, based on the detection information detected by a light detecting device, feedback control is performed to move the hologram recording medium to obtain the reconstruction light projection state without displacement and normally set the hologram recording medium. As a result, the compatibility can be secured and stabilized when a hologram recording medium is reset or is played by a different apparatus by positioning reconstruction reference light and the hologram recording medium with high precision and without complicating an apparatus. Furthermore, in order to perform the positioning, the positioning information of a hologram recording medium can be obtained by defining a or b so as not to satisfy a=2nb where a is an interval between/among photoreceptors, which face across a hole, of the light detecting means, b is an interval of data recorded in multibook on the hologram recording medium, and n is a natural number even in a case of reconstructing data multiplexed in multibook on the hologram recording medium.

According to the embodiment of the invention, when a hologram recording medium is displaced, it is difficult for necessary light to pass through the aperture, and the necessary light appears in the reconstruction light projection state information in an inner part of the projection area of the reconstruction light generated from the recording area in the outer circumference of the through hole of the aperture and adjacent to the recording area that is the reconstruction target. Thus, based on the detection information detected by a light detecting device, the hologram recording medium is moved to obtain the reconstruction light projection state without displacement. As a result, the compatibility can be secured and stabilized when a hologram recording medium is reset or is played by a different apparatus by positioning reconstruction reference light and the hologram recording medium with high precision and without complicating an apparatus to be used.

Therefore, the position of a target recording area can be found precisely even in a case where the recording area of a hologram recording medium is displaced from a known position in angle multiplexing. As a result, the reconstruction of a hologram can be performed smoothly and in a stable manner even when a hologram recording medium is removed and replaced.

Furthermore, in order to perform the positioning, the positioning information of a hologram recording medium can be obtained by defining a or b so as not to satisfy a=2nb where a is an interval between/among photoreceptors, which face across a hole, of the light detecting means, b is an interval of data recorded in multibook on the hologram recording medium, and n is a natural number.

DESCRIPTION OF THE PREFERRED EMBODIMENTS

First Embodiment

Figure 1:
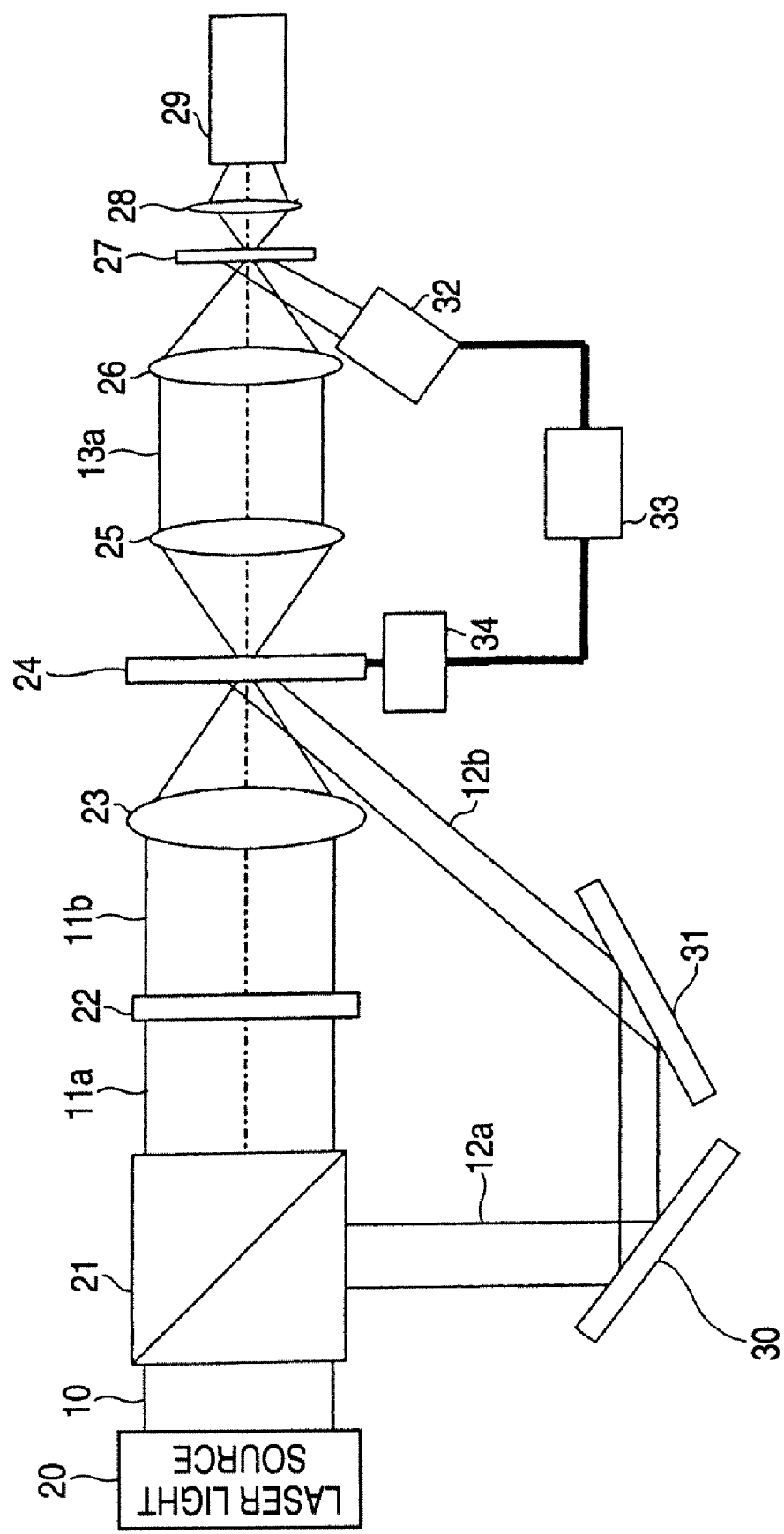
FIG. 1 is a block diagram showing a configuration of a hologram reconstructing apparatus according to a first embodiment of the invention.

FIG. 1 is a block diagram showing a configuration of a hologram reconstructing apparatus according to a first embodiment of the invention. A hologram reconstructing apparatus (including a recording system for convenience of description of this embodiment) includes a laser light source 20, a polarizing beam splitter (PBS) 21, a spatial light modulator 22, a signal light lens 23, a hologram recording medium 24, reconstruction light lenses 25 and 26, an aperture 27, a lens 28, an imaging device 29, a direction changing mirror 30, an angle adjustable mirror 31, a light detecting device 32, such as a CCD and a CMOS, that receives the projected light on the aperture 27, a position control section 33 that controls the position of the hologram recording medium 24, and a driving mechanism 34 that moves the hologram recording medium 24. If the only reconstruction function is necessary, the polarizing beam splitter (PBS) 21, spatial light modulator 22 and signal light lens 23 are not necessary.

An operation of this embodiment will be described next. Laser light 10 output from the laser light source 20 is divided into a P-wave 11a and an S-wave 12a by the PBS 21. The laser light source 20 may generally be one that generates waveforms near visible light. The P-wave 11a passes through the spatial light modulator 22 and is spatially modulated based on the data page displayed by the spatial light modulator 22 to be signal light 11b. The spatial light modulator 22 may generally be a transmissive LCD panel or a reflective LCD panel or may often be a device to be used for an image display apparatus, such as a DMD and a GLV. The signal light 11b is collected by the lens 23 to a recording area of the hologram recording medium 24. Here, the hologram recording medium 24 does not necessarily cross perpendicularly with the optical axis of the signal light 11b.

The direction of the S-wave 12a is changed by the mirror 30, and the S-wave 12a having the changed direction is input to the mirror 31 as reference light 12b. The angle of the mirror 31 is changeable, and the mirror 31 defines the incident angle of the reference light 12b to the hologram recording medium 24. The reference light 12b with the defined incident angle is irradiated to the hologram recording medium 24 so as to cover the irradiation range of the signal light 11a on the hologram recording medium. The signal light 11b and reference light 12b interfere in a recording area of the hologram recording medium 24, and the interference information is recorded in the recording area. Next, the data page to be recorded next is displayed on the spatial light modulator 22, and the incident angle of the reference light is changed by the mirror 31. Then, the information of the data page to be recorded next is multiplexed on the same recording area as interference information in the same manner.

After that, when only the same reference light 12b as the one in recording is irradiated to a recording area of the hologram recording medium 24 as reconstruction reference light 12b, the diffracted light reflecting the interference information recorded on the hologram recording medium 24 occurs and becomes reconstruction light 13a through the lenses 25 and 26, which are included in a 4f system, and is collected by the aperture 27. The part generating the diffracted light and the light collecting part of the aperture 27 are related as an object and a mirror image. The light excluding zeroth order light and/or light due to crosstalk from an adjacent recording area are removed by the aperture 27, and the light having reconstruction information only passes therethrough, and is further collected by the lens 28 to the imaging device 29, and is photoelectrically transduced by the imaging device 29 to reconstruction data.

Figure 2:
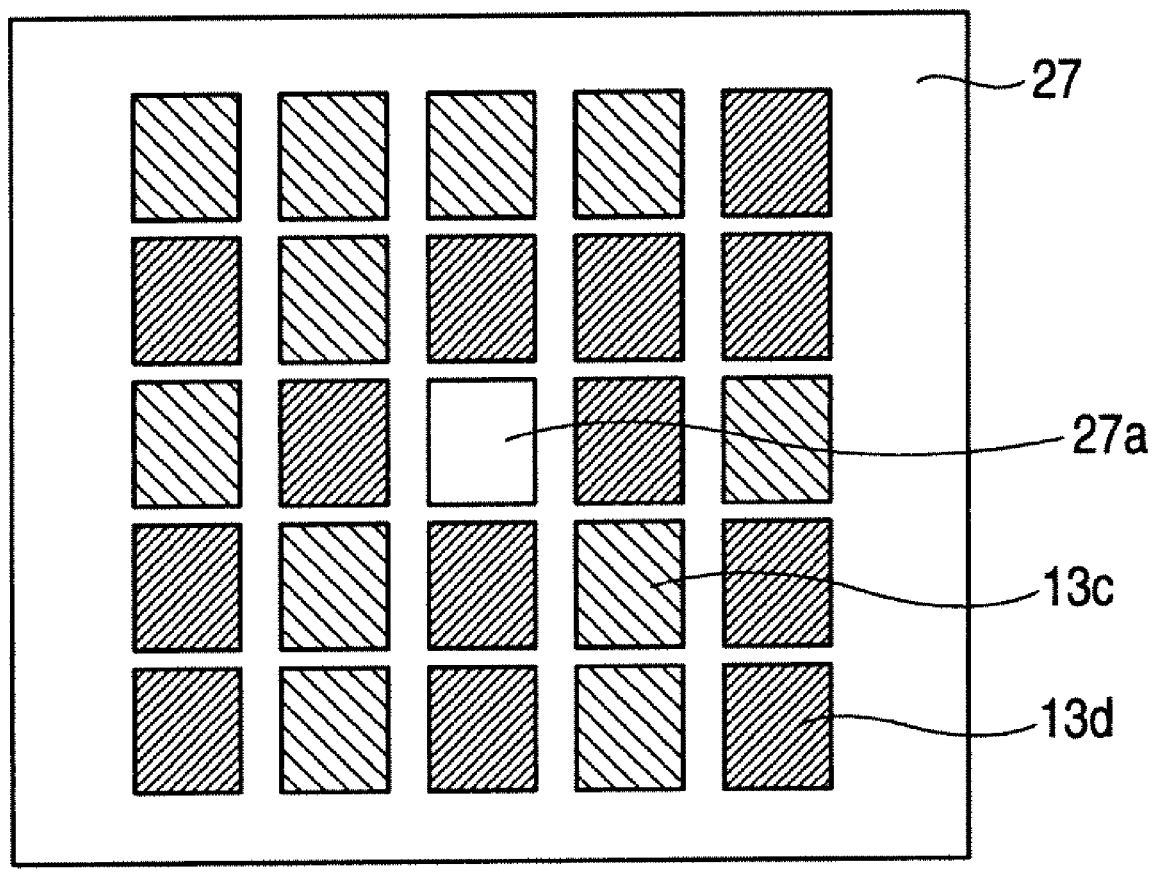
FIG. 2 is a diagram showing a state that reconstruction light is projected to the aperture shown in FIG. 1.

Here, as shown in FIG. 2, the aperture 27 has a light shield having a hole 27a. The size of the hole 27a is generally defined to a threshold amount of aperture. For this reason, the reconstruction light 13a generated from a target recording area passes through the hole 27a, and unnecessary light generated from an adjacent recording area is blocked by the light shield so as not to enter to the imaging device 29 side.

FIG. 2 is a diagram showing the front surface of the aperture 27. The aperture 27 has the light shield having the hole (through-hole) 27a. The size of the hole 27a is generally defined to a threshold amount of the aperture. Therefore, the aperture 27 allow only the zeroth order light of the reconstruction light 13a generated from a recording area that is a reconstruction target to pass through. The higher order light including first order light of the reconstruction light 13a generated from a recording area that is a reconstruction target, the reconstruction light of another data page, and reconstruction light generated from an adjacent recording area are displaced from the ray bundle of the zeroth order light and may not pass through the hole 27a. Therefore, undesired components are not included in the light entering to the imaging device 29. In a recording operation, the P-wave 11b and S-wave 12b are input to a recording medium for recording. In a reconstructing operation, the P-wave 11b is not used, and only the S-wave 12b is irradiated, and the recording information of the wave is transmitted in the direction of the lens 25. The PBS 21, spatial light modulator 22 and signal light lens 23 are not necessary if reconstruction is only necessary.

Here, as shown in FIG. 2, the reconstruction light 13c generated from the area adjacent to a recording area that is a reconstruction target and the reconstruction light 13d generated from a recording area adjacent to the recording area are projected to the front surface of the light shield of the aperture 27. Generally, unnecessary reconstruction light contains various components, but the intensity of the light of the components is much smaller than the intensity of the necessary light (zeroth order light of the reconstruction light 13a generated from a recording area that is a reconstruction target).

Figure 3:
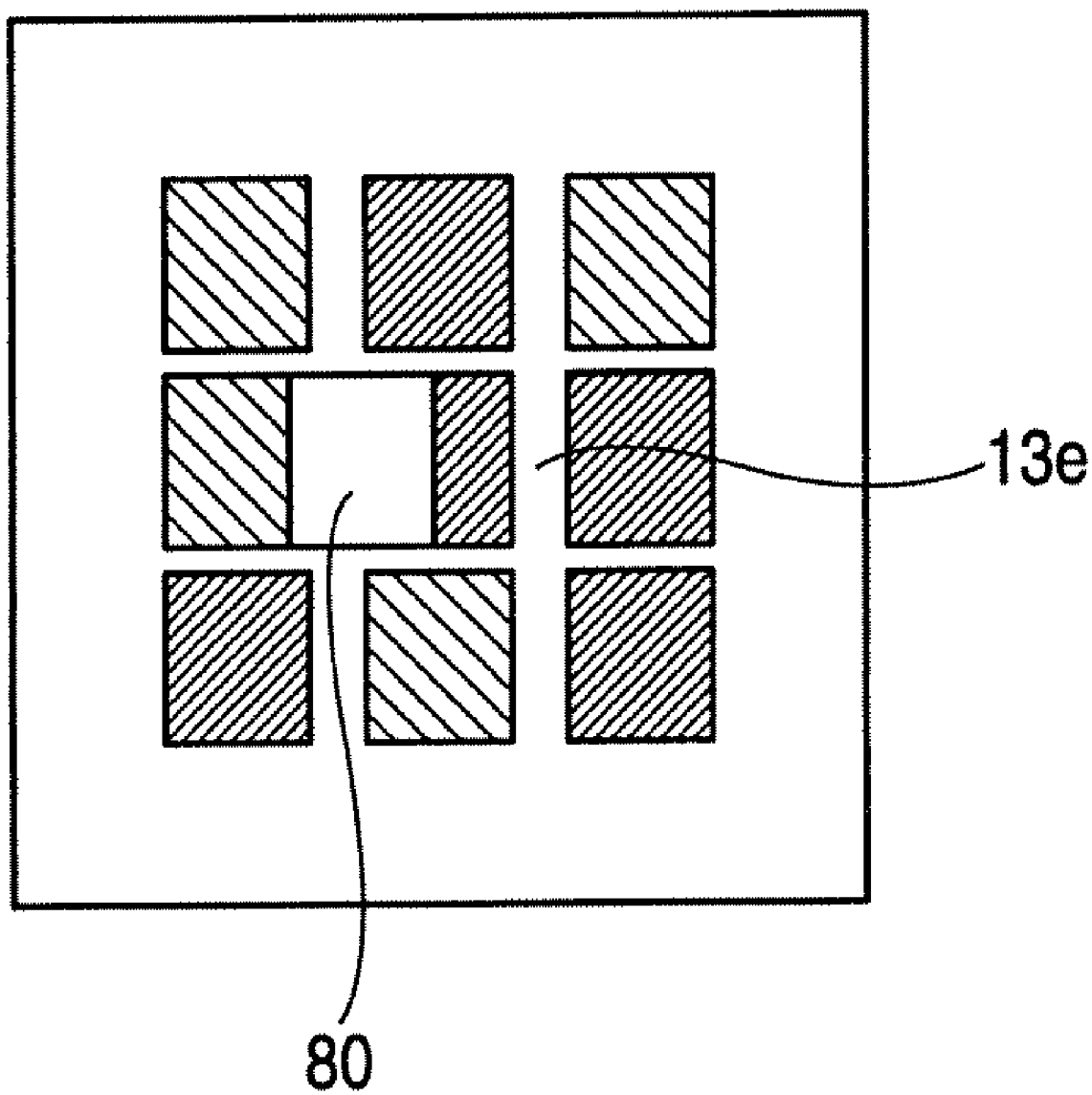
FIG. 3 is a diagram showing another state that reconstruction light is projected to the aperture shown in FIG. 1.

On the other hand, the photoreceptive surface of the detecting device 32 receives unnecessary light in the same layout as the one shown in FIG. 2. In other words, the state is equivalent to the state where the front surface of the light shield in FIG. 2 is replaced by the photoreceptive surface of the detecting device 32. Here, in a case where the set position of the hologram recording medium 24 is completely the same as that in recording, the zeroth order light of the reconstruction light 13a generated from the recording area that is a reconstruction target passes through the aperture 27, and unnecessary components of the reconstruction light is projected to the light shield as shown in FIG. 2. However, when the set position of the hologram recording medium 24 is displaced, the recording area that is a reconstruction target is displaced. Therefore, the direction of the zeroth order light of the reconstruction light 13a generated therefrom is displaced, and the front surface of the light shield of the aperture 27 has the projection state of the reconstruction light as shown in FIG. 3.

In other words, it is difficult for the zeroth order light 80 of the reconstruction light 13a to pass through the hole 27a of the aperture 27, and the zeroth order light is projected in some direction around the hole 27a. Here, even in a case where the photoreceptive surface of the light detecting device 32 is replaced by the front surface of the light shield shown in FIG. 3, completely the same projection state is obtained. Thus, the light reception level of the light receiving area on the left side of FIG. 3 is significantly high in the light receiving area around the hole 27a (which is indicated by the reference numeral 13e in FIG. 3 and is between the hole 27a and the projection position of the reference light 13c generated from the adjacent recording area in the outer circumference of the hole 27a of the aperture 27). As described above, since the zeroth order light of the reconstruction light 13a is significantly high in intensity, the direction of the displacement may be clearly recognized and can be detected by the increase in light reception level of a specific part of the light receiving area of the detecting device 32.

Upon detection of the displacement of the zeroth order light, a computer internally contained in the position control section 33 computes the amount and direction of the displacement. The computing and the positional control of the hologram recording medium 24 are performed by a microcomputer built in a PC or an IC. The light detecting device may generally be a CCD or a CMOS imager, for example, or may be a PIN diode by adjusting ray bundles well.

The position control section 33 obtains the displacement of the zeroth order light 80 of the reconstruction light 13a, that is, the displacement of the set position of the hologram recording medium 24 by performing image processing (or the computing) on detection information from the light detecting device 32, generates a drive control signal that corrects the displacement of the hologram recording medium 24, supplies the drive control signal to the driving mechanism 34, moves the hologram recording medium 24 so as to cancel the displacement (that is, so as to prevent the occurrence of the unbalance in light reception level of the light receiving area) and sets the hologram recording medium 24 to the right position. In other words, the feedback loop of the light detecting device 32 that detects the state of the reconstruction light 13a projected to the light shield of the aperture 27, the position control section 33, the driving mechanism 34, the movement of the hologram recording medium 24, and the change in state of the reconstruction light 13a projected to the light shield of the aperture 27 controls to typically set the hologram recording medium 24 at the right position without displacement.

Notably, the driving mechanism 34 may generally be any general actuator such as a stepping motor, an air cylinder and a linear motor. If optically possible, the subject to be moved by the driving mechanism 34 is not limited to the hologram recording medium 24, but the same effect as the movement of the hologram recording medium 24 can be obtained by moving the optical system such as the signal light lens 23, and lenses 25 and 26.

Figure 5:
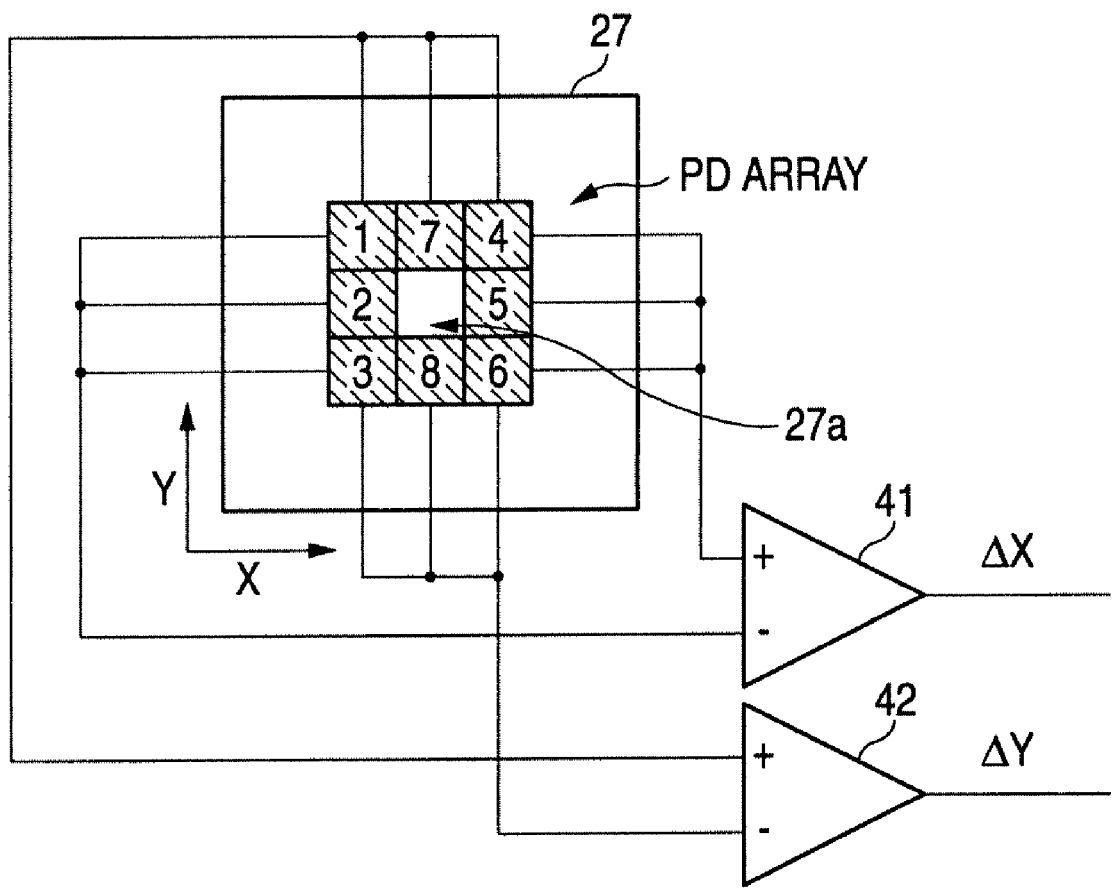
FIG. 5 is a block diagram showing the light detecting device shown in FIG. 1 and a circuit that extracts a signal therefrom.

FIG. 5 is a plan view showing the aperture 27 in the light detecting device 32. The aperture 27 has a photodetector array on a semiconductor material and a hole, functioning as the actual aperture, at the center. The hole is surrounded by photodetectors 1 to 8. Each of the photodetectors may be any semiconductor having the resistance value varying or causing an electromotive force upon reception of light, such as a general photodiode and a PIN diode. The displacement of the zeroth order light is detected through the photoreceptive section. The axial directions for positioning can be determined by obtaining, through an operational amplifier 41, the difference signal $\Delta X$ between the detectors (4,5,6) and (1,2,3) facing in the track width direction in FIG. 5, obtaining, through an operational amplifier 42, the difference signal $\Delta Y$ between the detectors (1,7,4) and (3,8,6) facing in the cross track direction in FIG. 5, inputting both of the signals to the position control section 33, and performing a predetermined operation.

Figure 6A:
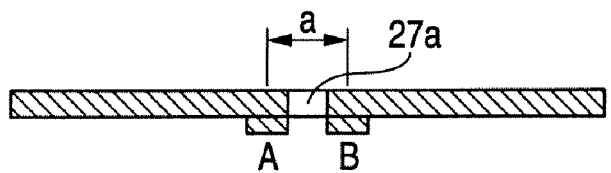
FIGS. 6A to 6D are diagrams illustrating the principle of the operation of positioning by a photodetector in reconstructing a hologram recorded in single book on a hologram recording medium that moves with constant velocity.
Figure 6B:
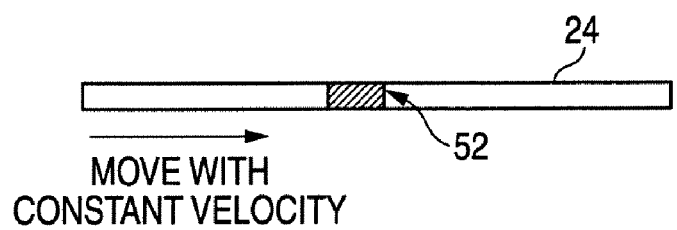
Figure 6C:
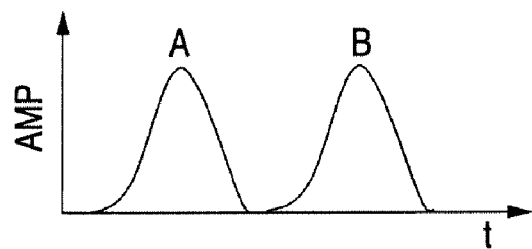
Figure 6C:
Figure 6D:
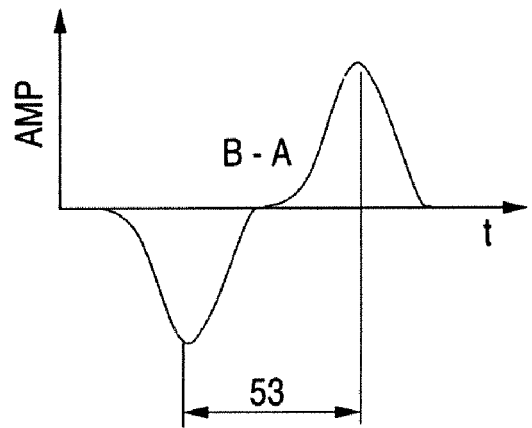

FIGS. 6A to 6D are diagrams illustrating the principle of the operation of positioning for reconstructing a hologram recorded on the hologram recording medium 24 that moves at a constant velocity by the photodetectors shown in FIG. 5. FIG. 6A is a section view of the photodetector, and photoelectric transducers (photodiodes) A and B are placed across the hole 27a. The space therebetween is a. FIG. 6B is a section diagram of the hologram recording medium 24 and includes a recorded hologram 52. FIG. 6C is a graph showing outputs of the photoelectric transducers A and B when the hologram recording medium 24 moves at a constant velocity. In this case, the output of the photoelectric transducers B-A is as shown in FIG. 6D, and the position control section 33 can correct the position of the hologram recording medium 24 in a range 53.

Figure 7A:
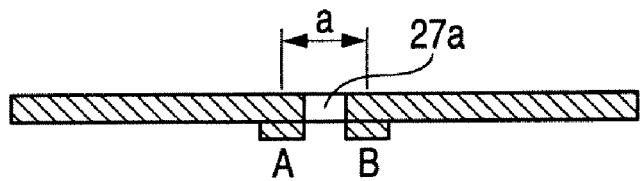
FIGS. 7A to 7F are diagrams illustrating the principle of the operation of positioning by a photodetector in reconstructing a hologram recorded in multibook on a hologram recording medium that moves with constant velocity.
Figure 7B:
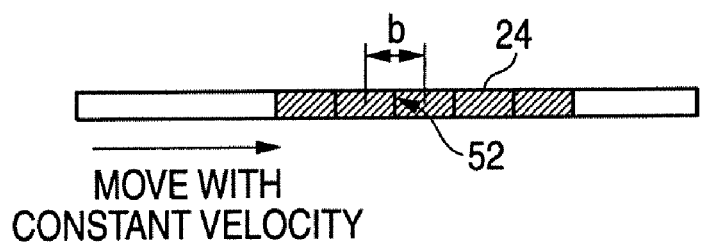
Figure 7C:
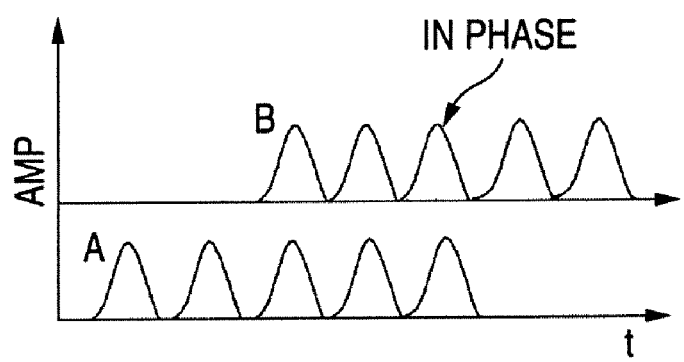
Figure 7C:
Figure 7D:
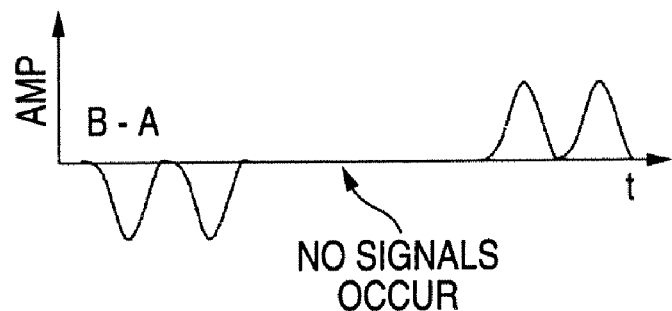
Figure 7E:
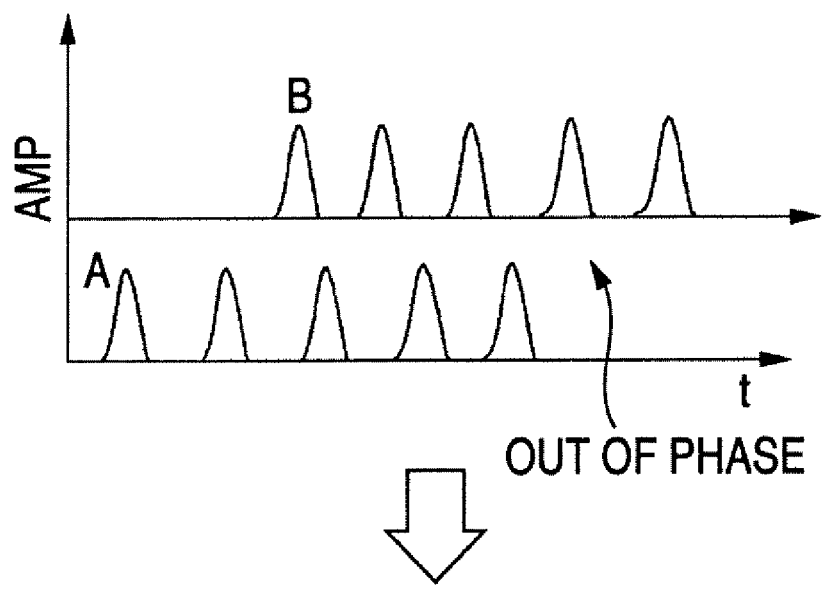
Figure 7F:
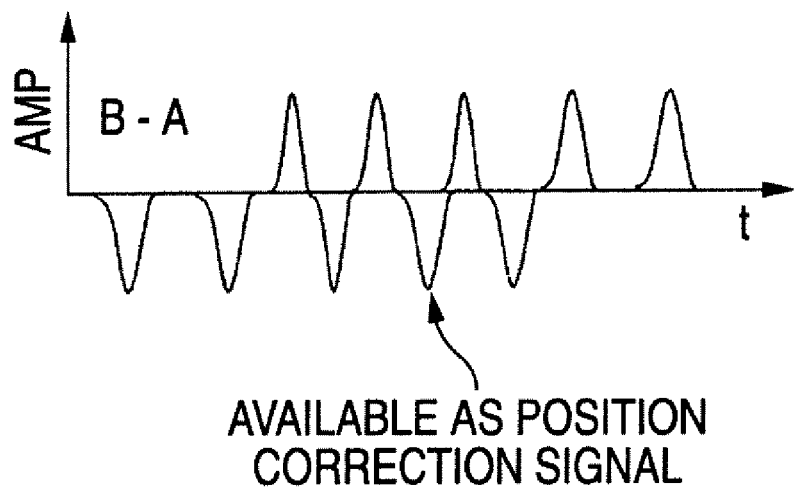

The operation has no problems in a single book case but has problems in a multibook case, which will be described below. FIG. 7A is a section diagram of the photodetector, and the photoelectric transducers A and B are placed across the hole 27a, and the center distance is a. FIG. 7B is a section diagram of the hologram recording medium 24 and includes a hologram 52 recorded in multibook. The center distance indicating the recording interval is b. FIG. 7C is a diagram showing output waveforms of the photoelectric transducers A and B. Here, the output of the photoelectric transducers B-A is as shown in FIG. 7C when a=2nb is satisfied where n is an arbitrary natural number. No signal occurs in some places as shown in FIG. 7D, and it is difficult to perform the position control in the range. Accordingly, a=2nb may be configured not to satisfy where a=b. In this case, the output of the photoelectric transducers B-A is as shown in FIG. 7E. The position correction signal can be obtained as shown in FIG. 7F, and the position control can be performed as expected.

Figure 4:
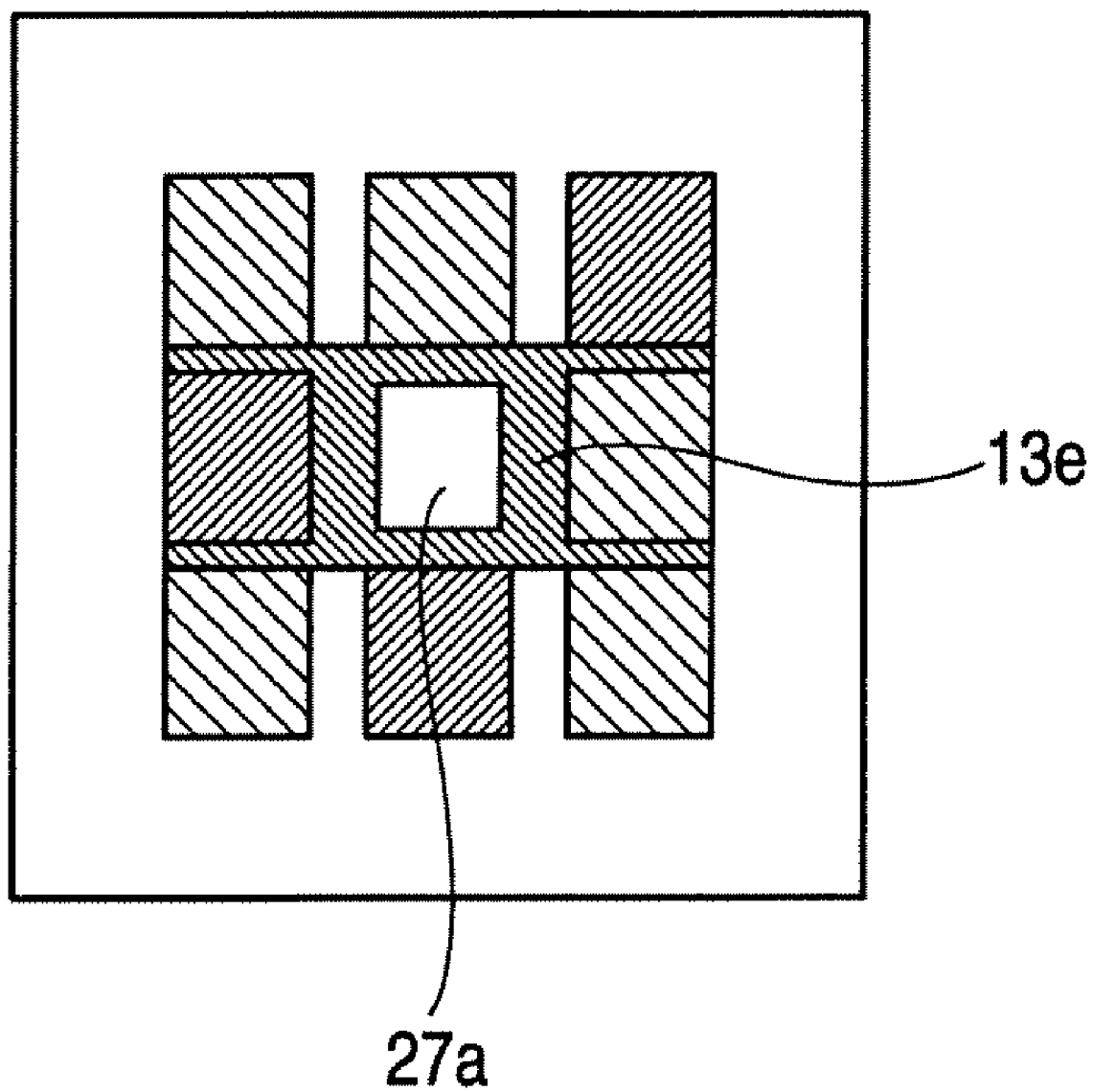
FIG. 4 is a diagram showing another state that reconstruction light is projected to the aperture shown in FIG. 1.
Figure 8:
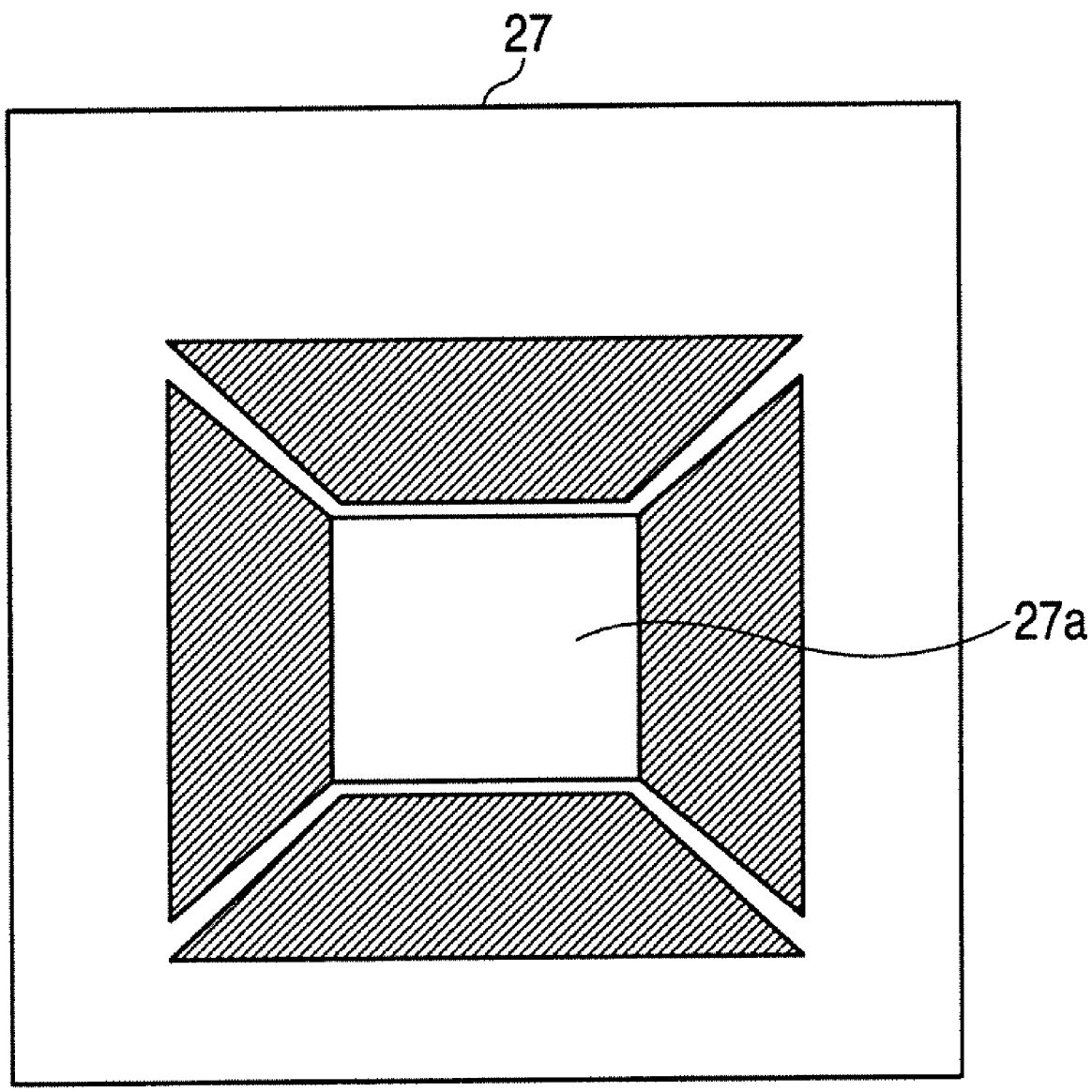
FIG. 8 is a plan view showing a configuration example of a light detecting device including four photodetectors.
Figure 9:
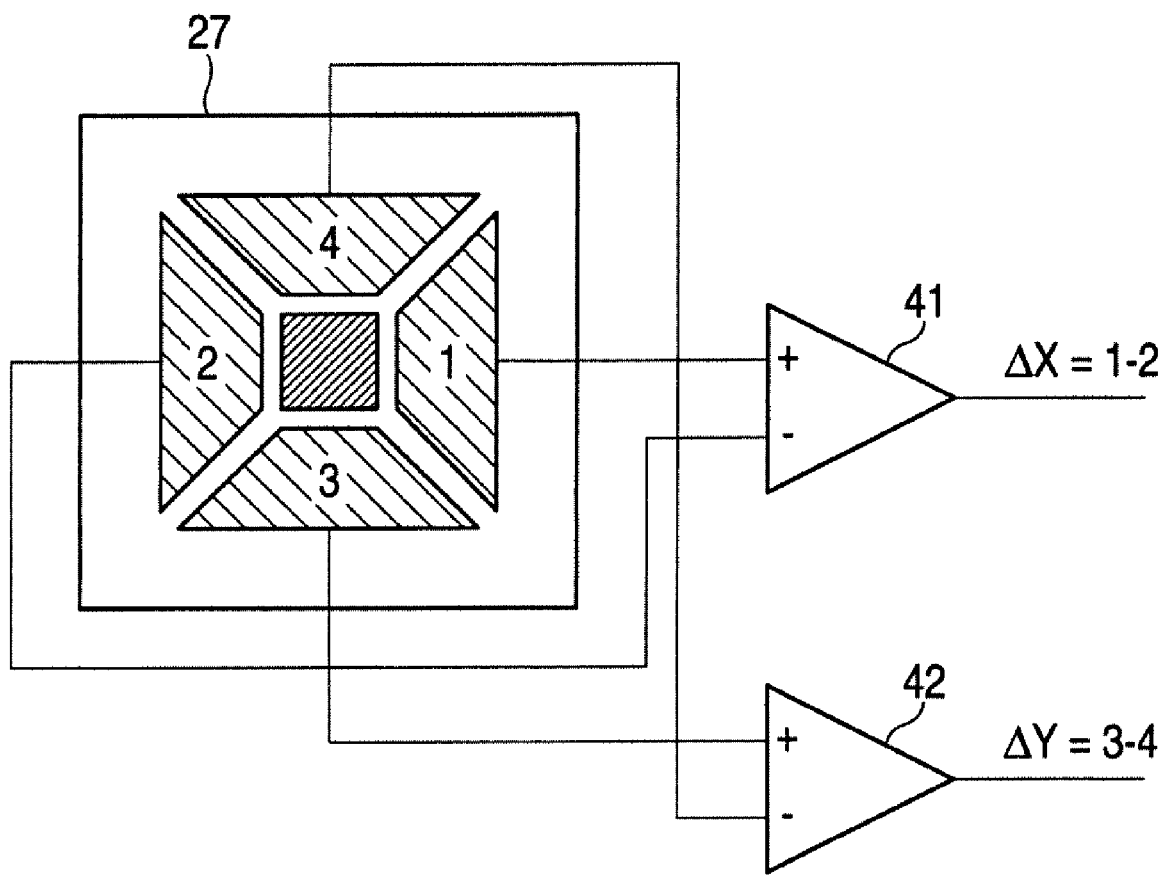
FIG. 9 is a block diagram showing the light detecting device shown in FIG. 8 and a circuit that extracts a signal therefrom.
Figure 10:
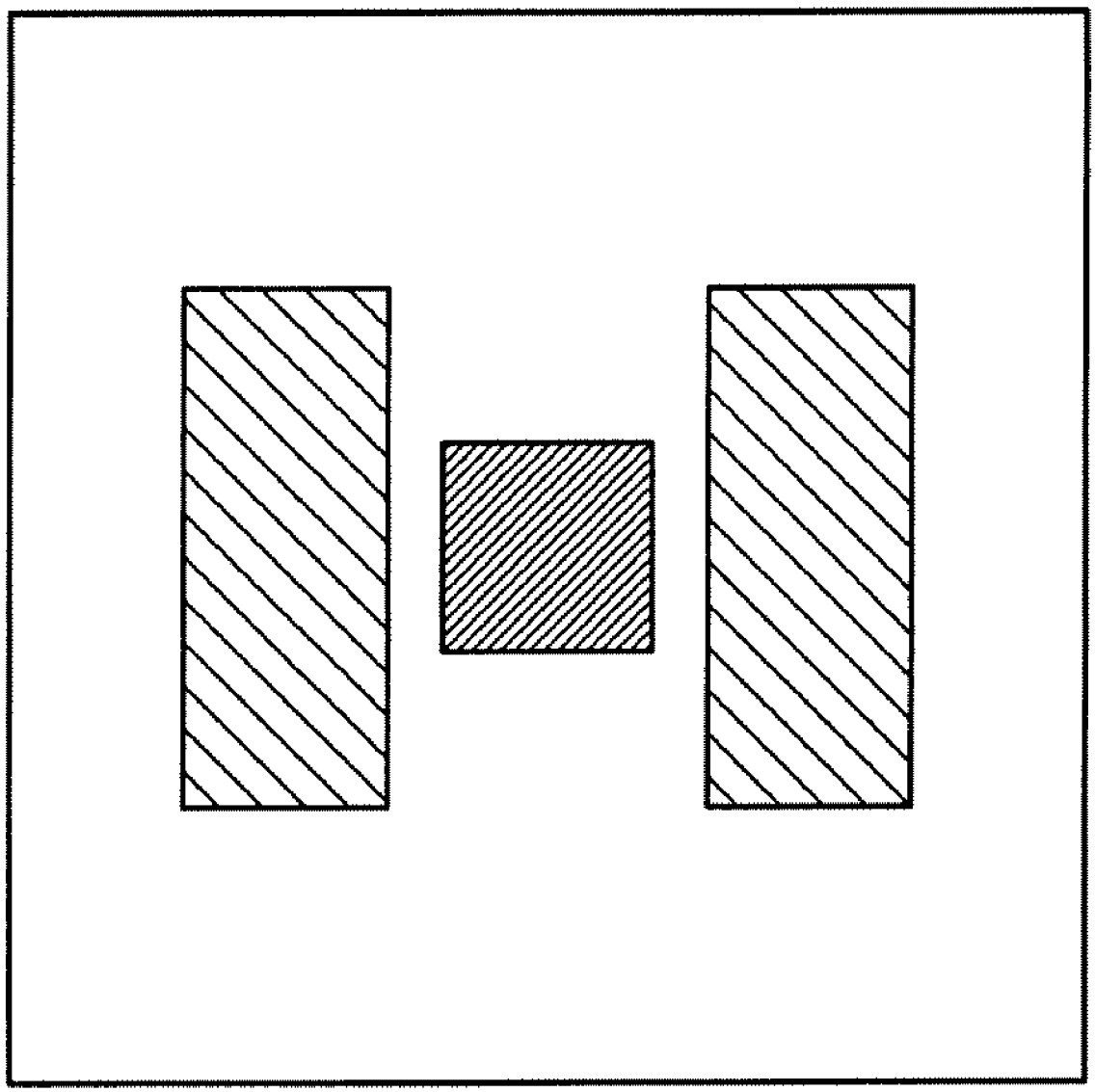
FIG. 10 is a plan view showing a configuration example of a light detecting device including four photodetectors.
Figure 11:
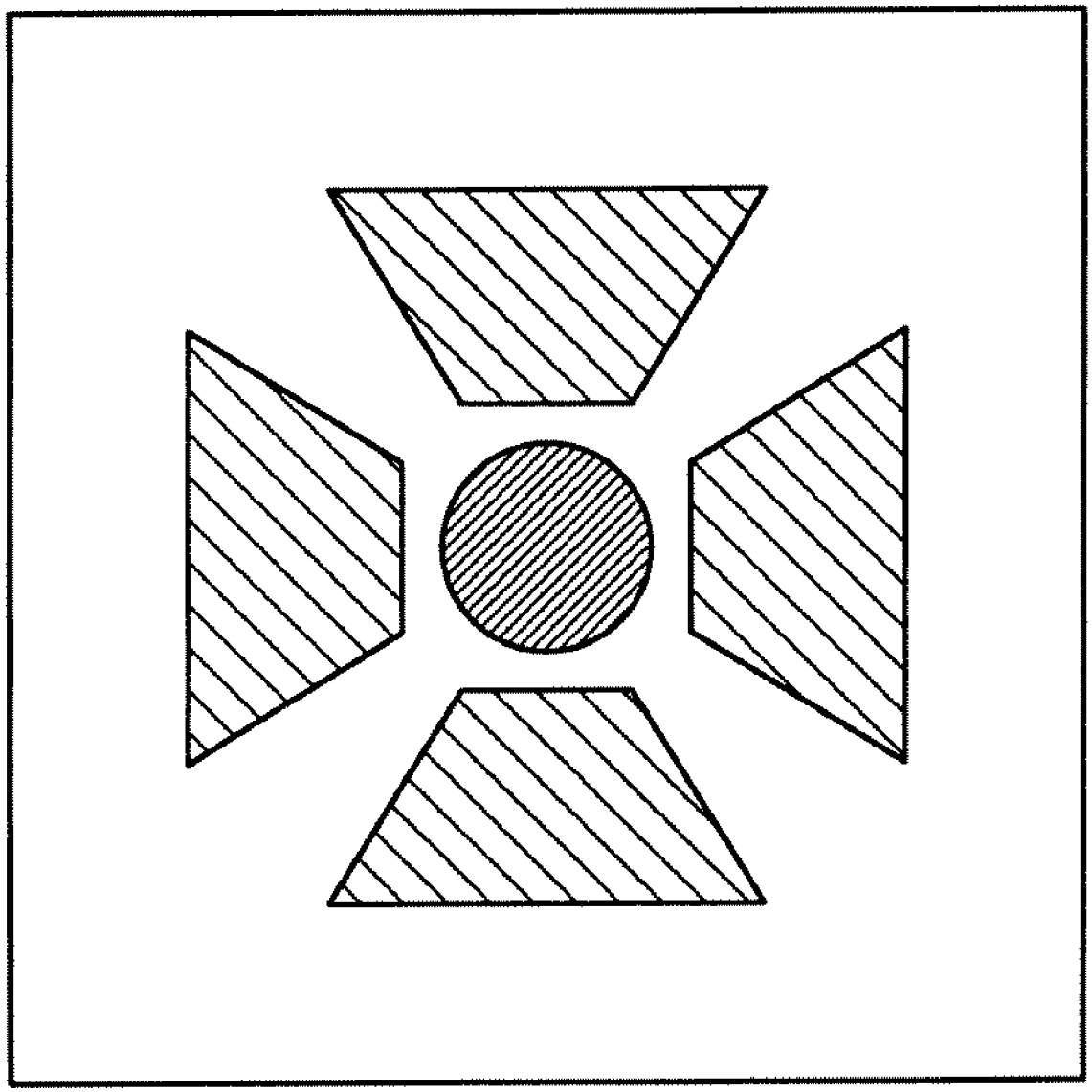
FIG. 11 is a plan view showing a configuration example of a light detecting device including four photodetectors.
Figure 12:
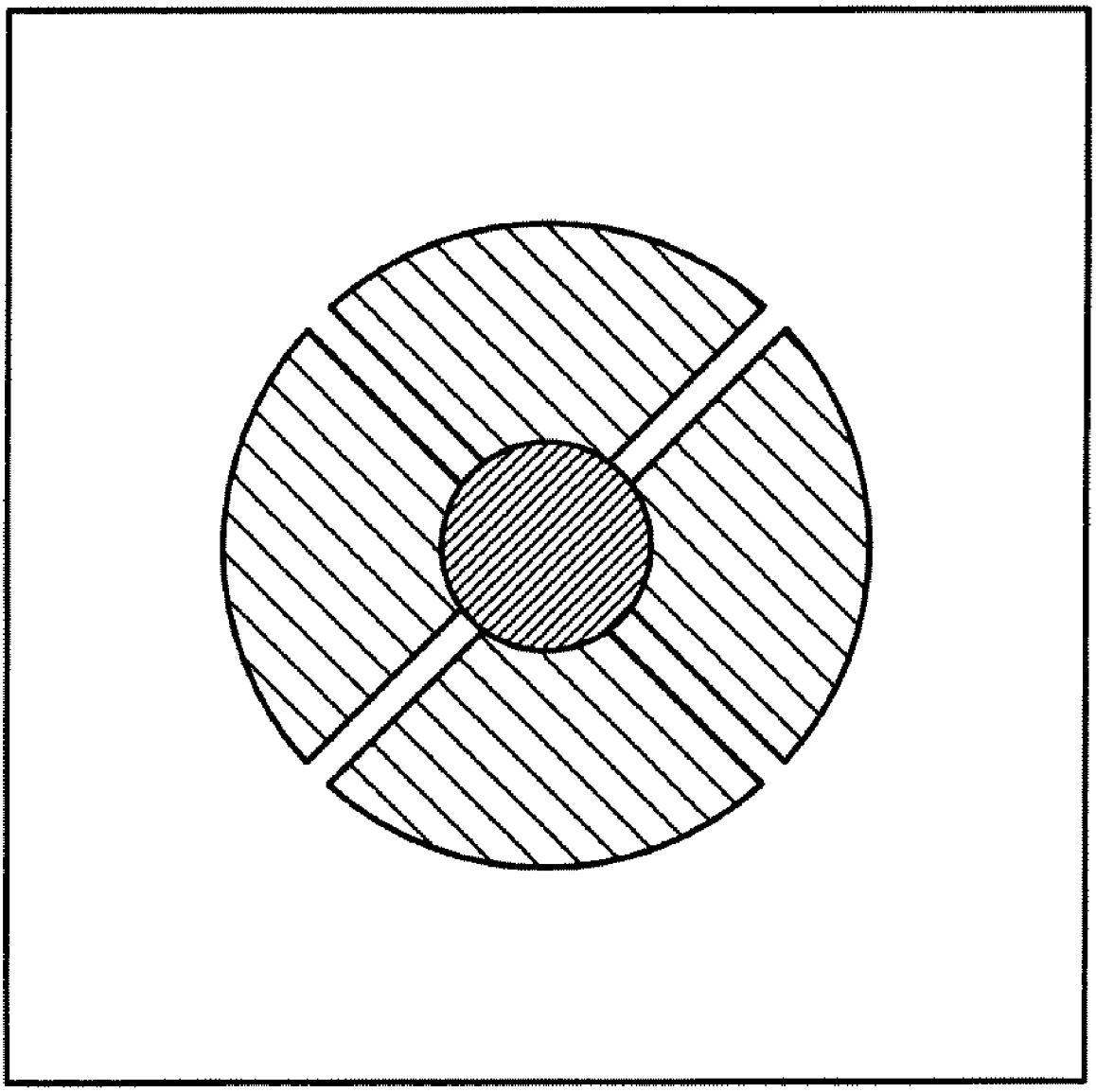
FIG. 12 is a plan view showing a configuration example of a light detecting device including four photodetectors.
Figure 13:
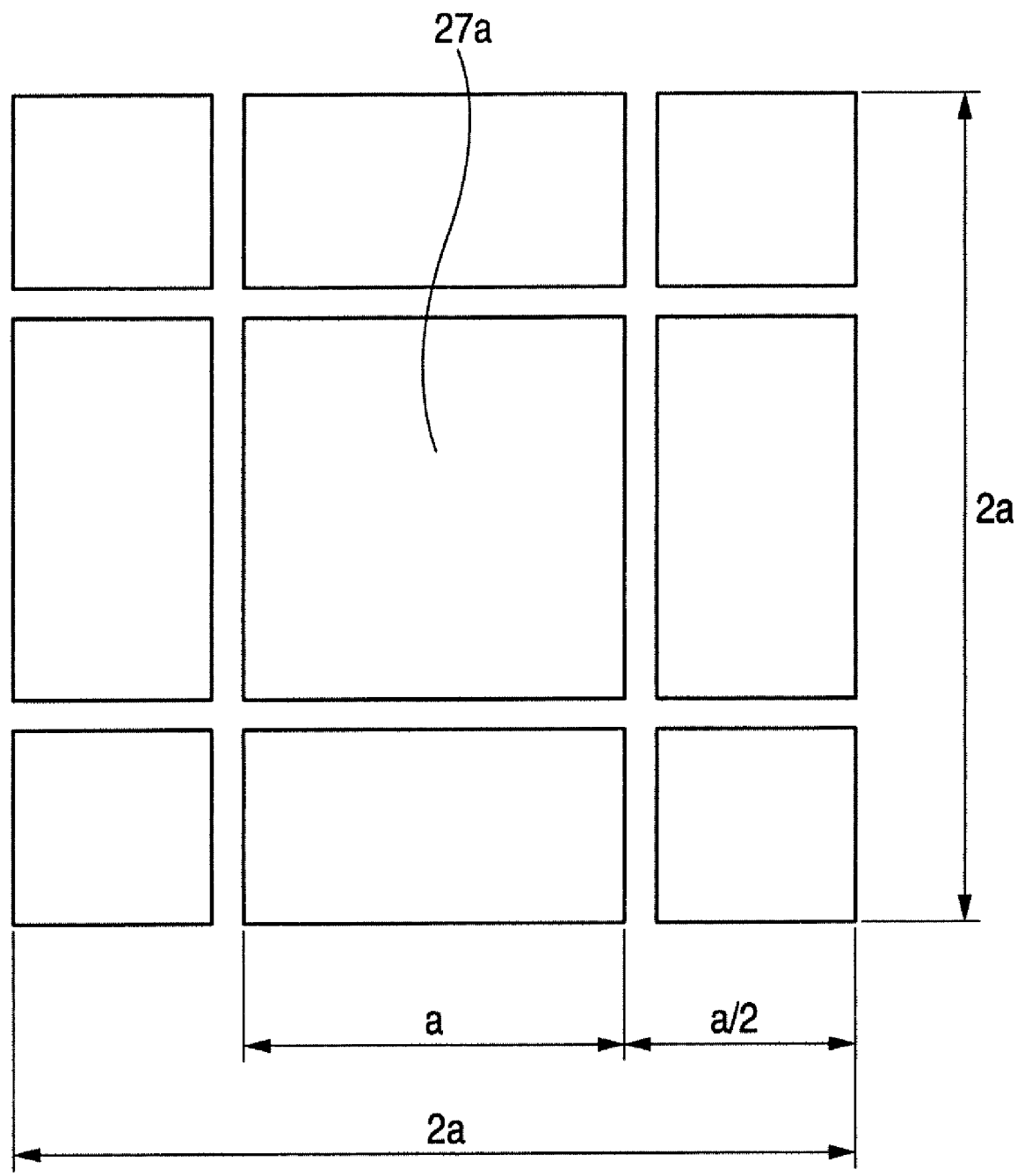
FIG. 13 is a diagram showing a relationship between the size of the hole of the aperture and the size of the photodetectors placed in the outer circumference.

Four detectors each having a trapezoid form as shown in FIG. 8 are used since the eight detectors as shown in FIG. 4 have a problem relating to costs and complicate calculations in the circuit. Thus, the number of photodetectors to be used can be reduced, which may contribute to the reduction of the costs of the photodetectors and circuit. In a case where the four detectors are used, a correction signal is extracted by using the circuit as shown in FIG. 9. Furthermore, in a case where one axis as shown in FIGS. 10, 11 and 12 is only to be detected, various forms of photodetectors may be applicable such as a case where photodiodes are placed in an arc form when the aperture is a circle. Furthermore, using a photodetector in the half of the size of the hole allows the steep occurrence of leakage light due to the position of the hologram recording medium 24. Thus, the detection of the position is allowed even when the recording density is increased.

In a case where the light receiving area 13e of the zeroth order light is off the aperture hole only in one direction or two directions as shown in FIG. 3, the axis or axes is or are detected, and the coaxial correction is performed thereon. However, the zeroth order light is received by the entire surrounding area of the hole, which means that the medium is displaced in the direction of optical axis (focus direction).

Figure 14:
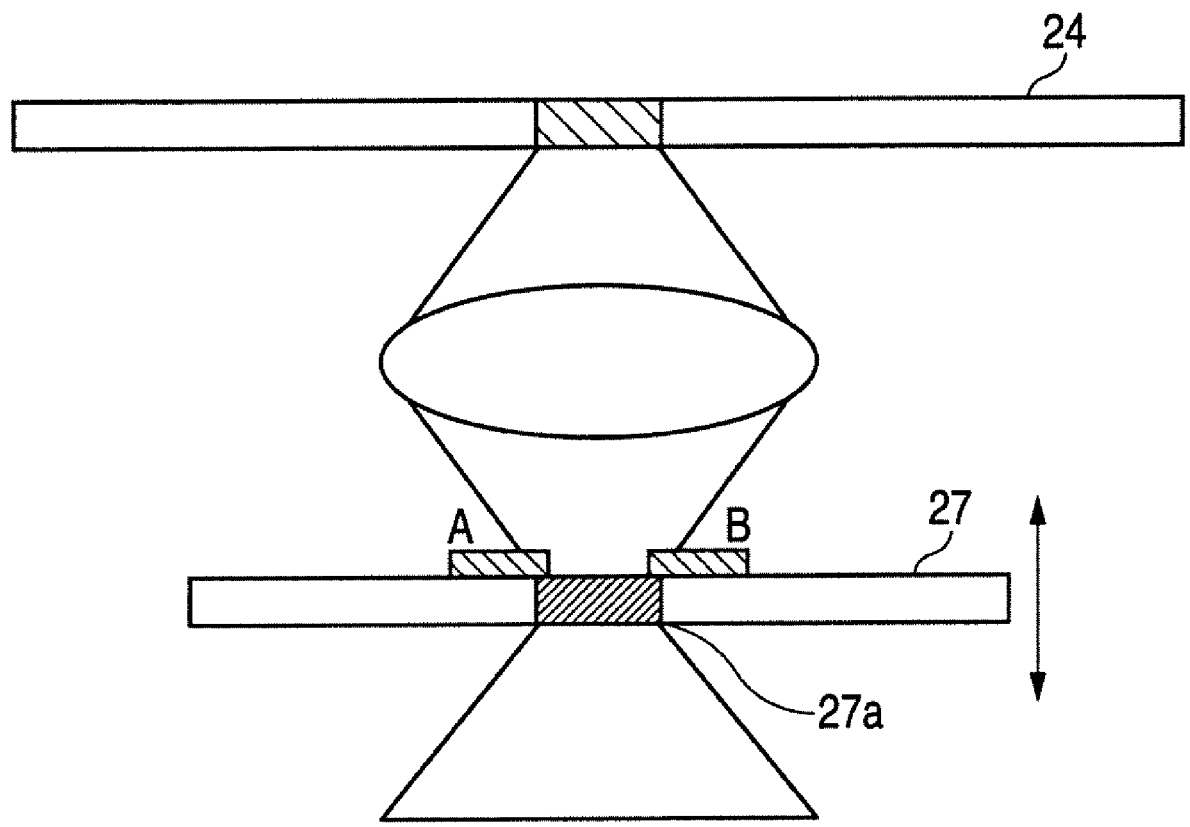
FIG. 14 is a diagram illustrating a method that detects a focus error by using the light detecting device shown in FIG. 1.
Figure 15:
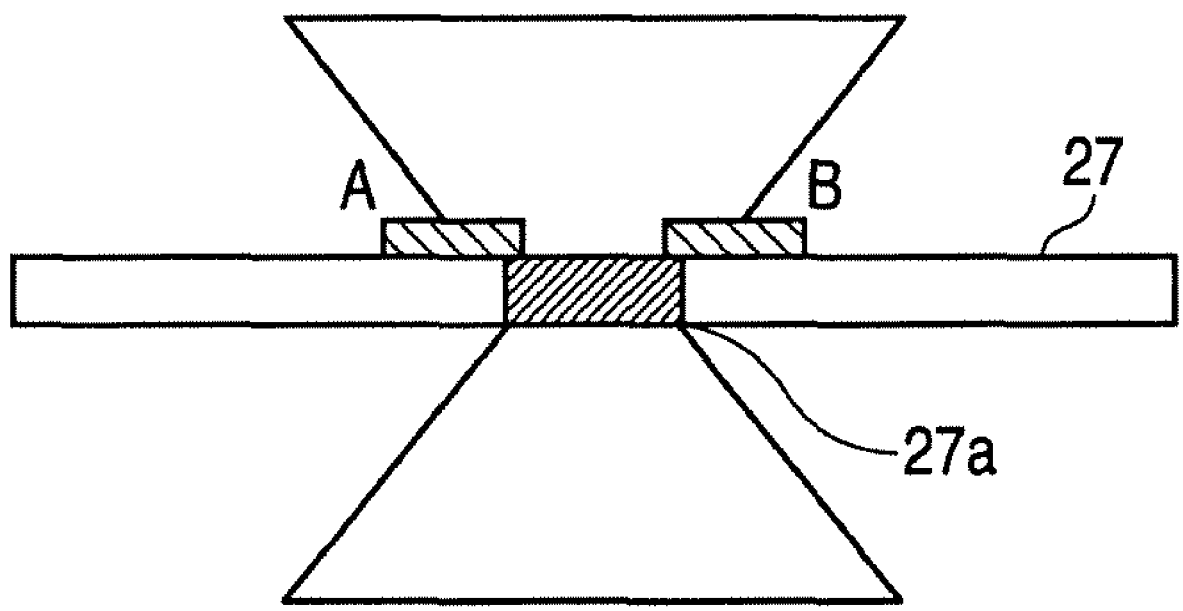
FIG. 15 is a diagram illustrating a method that detects a focus error by using the light detecting device shown in FIG. 1.
Figure 16:
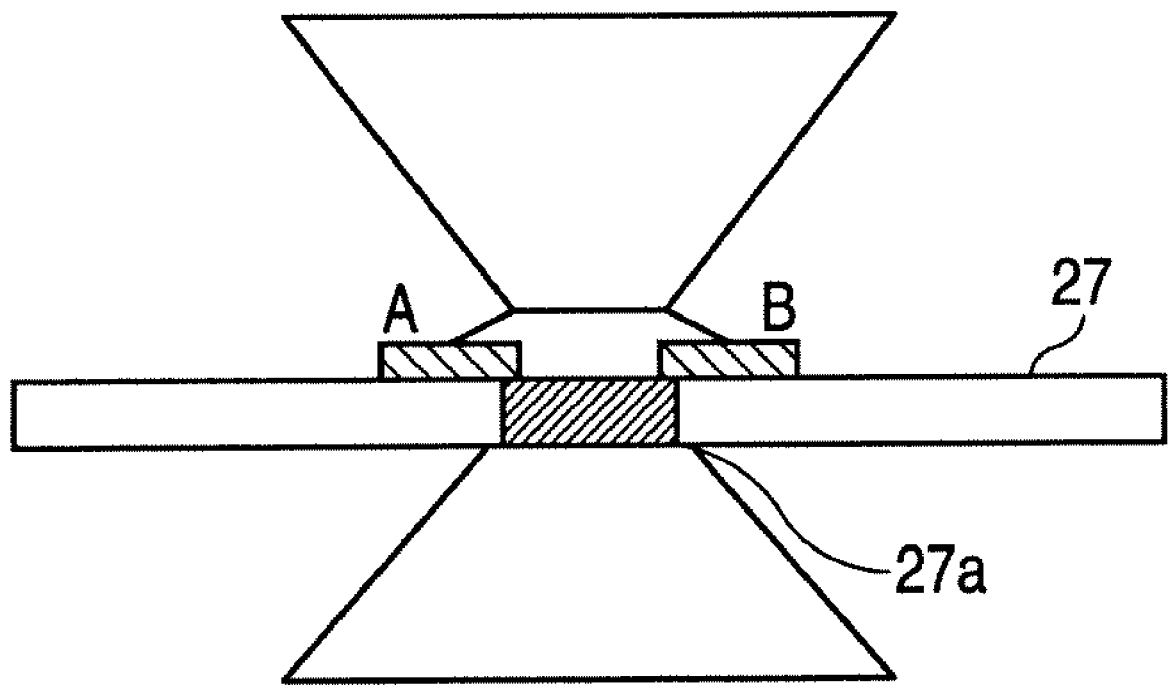
FIG. 16 is a diagram illustrating a method that detects a focus error by using the light detecting device shown in FIG. 1.
Figure 17:
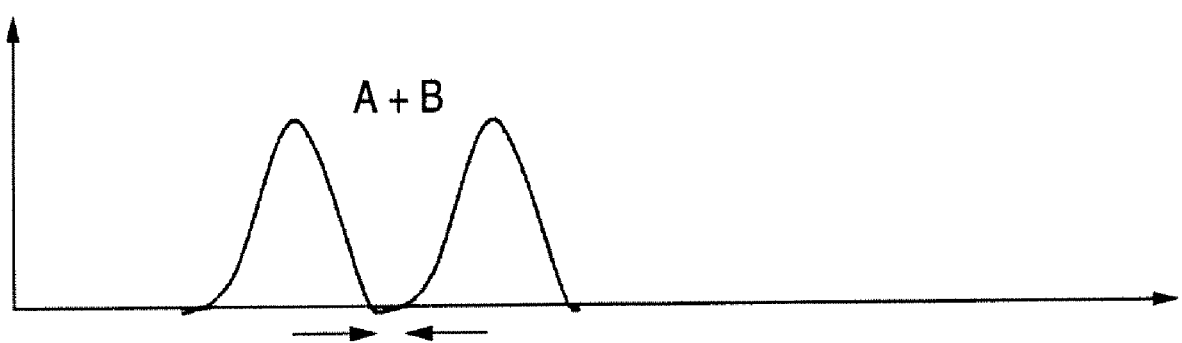
FIG. 17 is a diagram showing a waveform of a focus error signal obtained by the light detecting device shown in FIG. 1.

Here, in a case where the hologram recording medium 24 is placed at the right position in the focus direction (the direction of reconstruction light), all of the zeroth order light passes through the hole 27a, as shown in FIG. 14. In a case where the position of the hologram recording medium 24 is displaced in the focus direction (direction of reconstruction light), the ray bundle of the reconstruction light 13a is widened. Thus, the projection state of the reconstruction light 13a on the light shield is as shown in FIGS. 15 and 16, and the zeroth order light of the reconstruction light 13a generated from the recording area that is a reconstruction target overflows and spreads evenly around the hole 27a. If the light reception levels of the photoreceptors A and B of the light detecting device 32 are equal and are equal to or higher than a predetermined level, the position control section 33 determines that the hologram recording medium 24 is displaced in the focus direction. Then, the hologram recording medium 24 is moved in the focus direction by the driving mechanism 34 to the position of the valley of signal of the detectors A+B as shown in FIG. 17 due to wobbling, and the position of the hologram recording medium 24 is set there. Thus, the projection state of the reconstruction light at the aperture 27 is as shown in FIG. 14, and all of the zeroth order light of the reconstruction light 13a generated from the recording area that is a reconstruction target passes through the aperture 27 and is collected by the imaging device 29, and the reconstruction light 13a comes into focus.

In a case where the inclination of the hologram recording medium 24 about the axis intersection between the plane that the reconstruction reference light 12b changes in angle and the plane of the hologram recording medium 24 is different from that in recording, the reconstructed image data obtained by the imaging device 25 is darkened, and the S/N is deteriorated. This is because the waves of the reconstruction reference light 12b is slightly different from the waves of the reference light in recording even with the correct incident angle for reconstructing the data page with the reconstruction reference light 12b. Accordingly, the inclination of the hologram recording medium 24 is changed by the position control section 33 through the driving mechanism 34 such that the total sum of the light reception levels of the light receiving area (that is the part corresponding to 13e) of the photoreceptive surface of the light detecting device 32 can be maximum when the projection state of the reconstruction light 13a of the aperture 27 is displaced in focus as shown in FIG. 4. Thus, the inclination of the hologram recording medium 24 is defined to the one in recording, and the deterioration of the S/N of the reconstruction image data can be prevented.

According to this embodiment, the positional relationship between the irradiation beam of the reconstruction reference light 12b and the recording area of the hologram recording medium 24 can be typically agreed with the positional relationship between the irradiation beam of the reference light in recording and the recording area by, in reconstructing, detecting the reconstruction light projection state to the light shield of the aperture 27 of the reconstruction light 13a, detecting the displacement from the right position of the hologram recording medium 24 based on the detected state, and moving the position of the hologram recording medium 24 so as to cancel the displacement. This means that the range of the hologram recording medium 24 to which the reconstruction reference light 12b is irradiated agrees with the range of the reference light in recording and includes the recording area that is a reconstruction target. Furthermore, since all of the zeroth order light of the reconstruction light 13a is input to the imaging device 29 at that time, the data on the recording area that is the reconstruction target can be securely reconstructed from the reset hologram recording medium or the hologram recording medium having data recorded in a different apparatus. Therefore, the reset of the hologram recording medium 24 or the reconstruction of the data in the hologram recording medium 24 having undergone shift multiplexing by a different apparatus can be implemented without any problems.

According to this embodiment, reconstruction light is used for detecting the displacement of the hologram recording medium 24, and light with other wavelengths is not used for the detection. Therefore, optical systems may be configured as in the past, and no special optical system is necessary. A positioning control system in a simple configuration may be only added thereto. Therefore, the reduction in size of the apparatus is not prevented, and the effect as described above can be obtained inexpensively. Furthermore, since differences in wavelength do not differentiate characteristics (such as a temperature characteristic), the positioning of the hologram recording medium 24 can be performed with high precision.

According to this embodiment, the displacement of the hologram recording medium 24 is cancelled by controlling all of the zeroth order light of the reconstruction light 13a generated from the recording area that is a reconstruction target to pass through the aperture 27. Thus, an error or difference in set position of the reconstruction light optical system and/or imaging device 29 between the apparatus can be cancelled, and all of the zeroth order light of the reconstruction light 13a can be input to the imaging device 29. From this point of view, the compatibility between apparatus can be secured.

Furthermore, even in a case where data multiplexed in multibook on the hologram recorded medium 24 is to be reconstructed, the positioning information of the hologram recording medium in multibook recording can be obtained by defining a or b so as not to satisfy a=2nb where a is an interval between/among photoreceptors of the light detecting device 32, b is an interval of data recorded in multibook on the hologram recording medium 24, and n is a natural number. Therefore, the positioning as described above can be performed securely.

The invention is not limited to the embodiment above, and specific configurations, functions, operations, and effects can be implemented in other various forms without departing the spirit and scope of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A hologram reconstructing apparatus that irradiates reconstruction reference light to a hologram recording medium on which data is multiplexed, receives reconstruction light thus generated by the hologram recording medium by imaging means and demultiplexes and reconstructs the multiplexed data, the apparatus comprising:

unnecessary light removing means for causing the imaging means to receive necessary light only included in the reconstruction light;

driving means for operating the hologram recording medium or a reconstruction light optical system;

light detecting means for detecting the state that reconstruction light is projected to the unnecessary light removing means of the light cut by the unnecessary light removing means; and control means for obtaining the displacement of the hologram recording medium based on the information on a specific part of the projection state information detected by the light detecting means and controlling the driving means to cancel the displacement and move the hologram recording medium or the optical system, wherein a or b is defined so as not to satisfy a=2nb where a is an interval between/among photoreceptors of the light detecting means, b is an interval of data recorded in multibook on the hologram recording medium, and n is a natural number.

2. The hologram reconstructing apparatus according to claim 1, wherein, in a case where the unnecessary light removing means is a light shield having a through-hole, the light detecting means includes:

multiple photoelectric transducers placed within a projection area of reconstruction light generated from a recording area in the outer circumference of the through-hole and adjacent to a recording area, which is the reconstruction target.

3. The hologram reconstructing apparatus according to claim 2, wherein the photoelectric transducers are placed at facing positions across the through-hole.

4. The hologram reconstructing apparatus according to claim 3, wherein the displacement of the hologram recording medium is obtained by using a difference signal of signals obtained from the photoelectric transducers placed at facing positions.

5. The hologram reconstructing apparatus according to claim 3, wherein a difference signal is extracted from two pairs of the photoelectric transducers placed at facing positions, and the displacement of the hologram recording medium in two directions from two difference signals.

6. The hologram reconstructing apparatus according to claim 3, wherein the number of the photoelectric transducers to be placed in the outer circumference of the through-hole is at least four.

7. The hologram reconstructing apparatus according to claim 3, wherein the width of the multiple photoelectric transducers placed at facing positions through the through hole is approximately half or smaller of the diameter of the through-hole.

8. The hologram reconstructing apparatus according to claim 3, wherein the form of the multiple photoelectric transducers placed at facing positions across the through-hole is arbitrary.

9. The hologram reconstructing apparatus according to claim 2, wherein the photoelectric transducers are PIN diodes.

10. The hologram reconstructing apparatus according to claim 1, wherein the unnecessary light removing means is a photodiode array having a through-hole, and the photodiode array functions as both of the light shield and the light detecting means.

11. The hologram reconstructing apparatus according to claim 1, wherein the displacement of the hologram recording medium includes one in the focus direction.

12. The hologram reconstructing apparatus according to claim 1, wherein the data is multiplexed on the hologram recording medium by angle multiplexing.

13. The hologram reconstructing apparatus according to any one of claims 1 to 3, wherein the light detecting means receives the state of the projection of the reconstruction light to a light shield, and the control means obtains the displacement of the hologram recording medium based on the projection state information of an inner part of the projection area of the reconstruction light generated from a recording area in the outer circumference of the through hole of the light shield and adjacent to a recording area, which is the reconstruction target.

* * * * *